(12) United States Patent
Zheng

(10) Patent No.: US 6,614,065 B2
(45) Date of Patent: Sep. 2, 2003

(54) USE OF MEMBRANE PROPERTIES TO REDUCE RESIDUAL STRESS IN AN INTERLAYER REGION

(75) Inventor: Dawai Zheng, Los Angeles, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/238,081

(22) Filed: Sep. 10, 2002

(65) Prior Publication Data

US 2003/0021971 A1 Jan. 30, 2003

Related U.S. Application Data

(62) Division of application No. 09/917,301, filed on Jul. 26, 2001, now Pat. No. 6,498,086.

(51) Int. Cl.⁷ .......................... H01L 27/20; H01L 29/84
(52) U.S. Cl. ...................... 257/254; 257/417; 257/418
(58) Field of Search ................................ 257/254, 417, 257/418, 419; 438/53, 597

(56) References Cited

U.S. PATENT DOCUMENTS

| | | | |
|---|---|---|---|
| 3,853,650 A | 12/1974 | Hartlaub | |
| 4,851,080 A | 7/1989 | Howe et al. | |
| 5,110,373 A | 5/1992 | Mauger | |
| 5,146,435 A | 9/1992 | Bernstein | |
| 5,332,469 A | 7/1994 | Mastrangelo | |
| 5,344,523 A | 9/1994 | Fung et al. | |
| 5,631,198 A | 5/1997 | Hartauer | |
| 5,721,162 A | 2/1998 | Schubert et al. | |
| 6,030,851 A | 2/2000 | Grandmont et al. | |
| 6,150,681 A | * 11/2000 | Allen | 257/254 |
| 6,207,470 B1 | * 3/2001 | De Bortoli | 438/53 |
| 6,498,086 B1 | * 12/2002 | Zheng | 438/597 |
| 2002/0034843 A1 | 3/2002 | Udrea et al. | |

* cited by examiner

Primary Examiner—Alexander Ghyka
(74) Attorney, Agent, or Firm—Blakely, Sokoloff, Taylor & Zafman LLP

(57) ABSTRACT

A method and apparatus comprising thinning a substrate sufficiently to allow it to be mechanically compliant with a material deposited on its surface is disclosed. The mechanical compliance allows a reduction in the interlayer stress generated by dissimilarities in the materials.

6 Claims, 3 Drawing Sheets

---

PROVIDING A FIRST LAYER OF A FIRST MATERIAL
710

↓

THINNING SAID FIRST MATERIAL SUFFICIENT TO ALLOW THE FIRST MATERIAL TO BE MECHANICALLY COMPLIANT WITH A LAYER OF A SECOND MATERIAL DEPOSITED ON THE FIRST MATERIAL
720

↓

DEPOSITING THE SECOND MATERIAL ON THE FIRST MATERIAL WHEREIN THE DEPOSITION OF THE SECOND MATERIAL ON THE FIRST MATERIAL GENERATES AN INTERLAYER STRESS
730

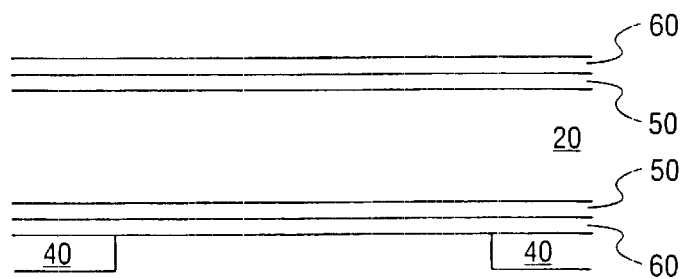
FIG. 4A
FIG. 4B
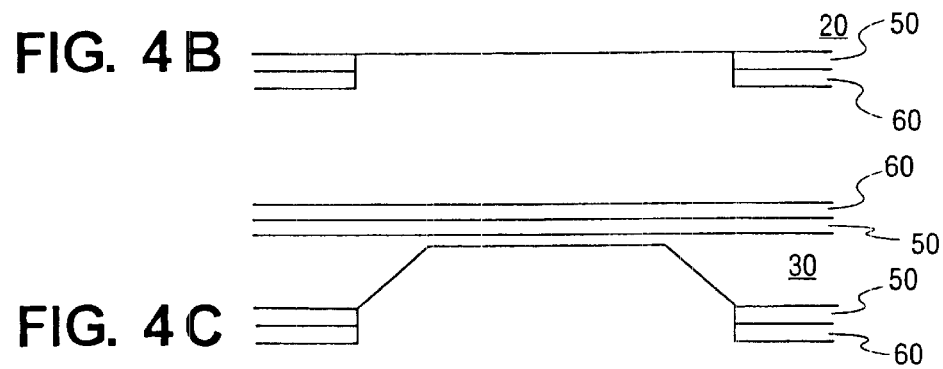
FIG. 4C
FIG. 4D
FIG. 4E
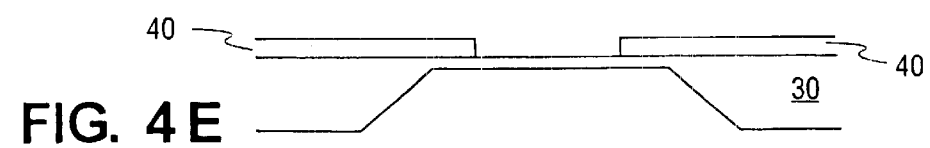
FIG. 4F
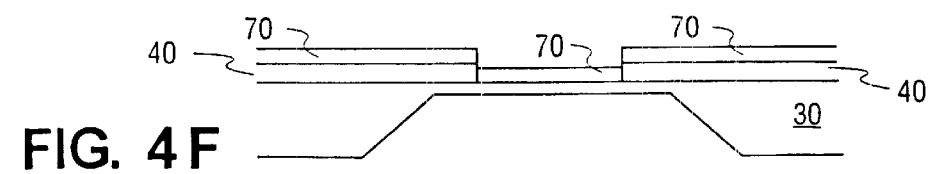
FIG. 4G
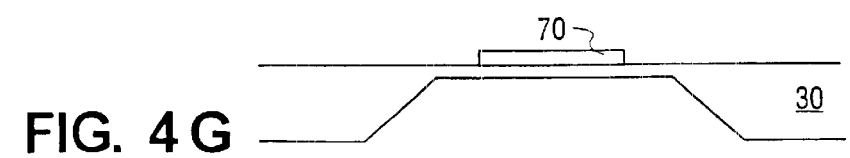

USE OF MEMBRANE PROPERTIES TO REDUCE RESIDUAL STRESS IN AN INTERLAYER REGION

CROSS-REFERENCE TO RELATED APPLICATION

The application is a Divisional of co-pending application Ser. No. 09/917,301, filed Jul. 26, 2001 now U.S. Pat. No. 6,498,086 by applicant, Dawei Zheng, entitled "Use of Membrane Properties to Reduce Residual Stress in an Interlayer Region."

BACKGROUND

1. Field of the Invention

The invention relates to interlayer stress reduction. More specifically, the invention relates to use of membrane properties to reduce residual stress at an interlayer.

2. Background

Deposition layers in semiconductor processing have been shrinking since the invention of the microprocessor. Current thicknesses of deposition layers in state of the art microprocessors, for example, run to approximately 1 micron in depth. With advancing technology, it is easily foreseeable that deposition layer thicknesses will become even smaller.

Whenever one material is deposited upon another, there is a mismatch between the materials that is inherent in the nature of the materials. This mismatch can be the result of differences in morphology, i.e., a crystal lattice, or this can be the result of differences in co-efficient of thermal expansion between the two materials. Typically, when a material is deposited on another, the deposition takes place at an elevated temperature to enhance the deposit materials' ability to adhere to the surface of the material upon which it is deposited, i.e. the substrate. As these materials are cooled to operating temperatures, for example room temperature, if there is a mismatch in their co-efficient of thermal expansion; one material will contract at a different rate from the other material. If the deposited material has a greater co-efficient of thermal expansion than the substrate, the deposited material will contract more than the substrate area it covered at deposition. When the combination of the two materials reaches operating, or room temperature, there will be a tensile stress on the deposited material because of this difference in contraction. If, on the other hand, the co-efficient of thermal expansion of the substrate material is greater than the substrate, there will be a compressive stress on the deposited material due to the substrate's shrinking faster than it.

Stress in an interlayer region such as this propagates into both layers of the deposited and the substrate materials. This stress inhibits operation of the device in ways of, for example, degradation of electron mobility within the area of stress because the reciprocal lattice is no longer symmetrical. Additional results of high interface stress can be electromigration, delamination at the interface, and stress migration where crystals move around to attain a relaxed state.

Electromigration is a failure phenomena that typically occurs when an electric current is passed through a stressed material. The end result is the formation of hillocks and voids in a material due to the development of severe mechanical stresses and stress gradients. Hillocks can lead to short circuit failures, and voids can lead to open circuit failures.

Delamination is a failure that generally takes place when the interlayer bond yields and the two materials separate. This happens, for example, when the differential in the morphological or crystallographic properties is sufficient to break the adhesion between the layers.

Stress migration is typically caused by stress mismatch between lattices. It results in crystals moving around to attain a relaxed state. This movement may cause voids in an interface.

When depositing a relatively thin layer of a first material, or material "A", on a second material, or material "B", wherein the second material is acting as the substrate, typically the first material will become polycrystalline or amorphous as it deposits on the surface of the second material. This is because it is rare to have identical morphological, or crystallographic, properties in dissimilar materials. Whether morphological spacing of the material is smaller than the material that makes the substrate causing tension in the deposition layer, or the morphological structure of the deposition layer is larger than that of the substrate causing compression in the deposition layer, the material coming down on top of already deposited material "A" will see a confinement that is caused by the mismatch with material "B". While the physical constants of material "B" are confining the deposition of material "A", the growth is termed pseudomorphic, because material "A" is being constrained away from its own structure and toward the structure of material "B". Once of course a sufficient critical thickness of material "A" has been reached, the deposited material relaxes and the growth is no longer pseudomorphic. However, prior to reaching this critical thickness, the deposited material is confined by the structure of the substrate material.

BRIEF DESCRIPTION OF THE DRAWINGS

FIGS. 4A–4G are schematic cross-sectional side views of a thin deposition on a thinned substrate.

DETAILED DESCRIPTION

Figure 1:
FIG. 1 is a schematic cross-sectional side view of a relatively thin deposition of a material on a relatively thick substrate.

In the following description, for purposes of explanation, numerous specific details are set forth to provide a thorough understanding of the claims. It will be apparent, however, to one of ordinary skill in the art, that the claims may be practiced without some of the specific details mentioned in the description. The following description and accompanying drawings provide examples for the purpose of illustration. However, these examples should not be construed in a limiting senses, as they are merely intended to provide examples of the claims, rather than to provide an exhaustive list of all possible implementations of the claims.

Reference will now to be made to drawings wherein like structures will be provided with like reference designations.

In order to show the structures of the claims most clearly, the drawings included herein are diagrammatic representations of integrated circuit structures. Thus, the actual appearance of the fabricated structures, for example in a photomicrograph, may appear different while still incorporating the essential structures of the claims. Moreover, the drawings show only the structures necessary to understand the claims. Additional structures known in the art have not been included to maintain the clarity of the drawings.

A conventional deposition, for example a germanium deposition on a silicon substrate, typically has a very thin film deposition on a relatively thick substrate. In one example, the thin film will be approximately one micron thick while the substrate, for example an 8 inch diameter silicon wafer, will be between 750–800 microns thick. The germanium silicon system typically has a four percent mismatch in crystal lattice spacing. That is, the crystal lattice of germanium is about four percent larger than the crystal lattice of silicon. When a thin film of germanium is deposited on a silicon substrate, the crystal lattice of the silicon substrate confines the crystal lattice of the germanium deposition. The confinement of the germanium crystal lattice places the germanium deposition into compression as the four percent larger crystal lattice of the germanium attempts to fit in the silicon substrate lattice. Short of defect generation to relieve stress at the interface between the silicon and germanium, the mismatch in the crystal lattice will generate an interlayer stress gradient that will propagate into both layers of germanium deposited on the silicon substrate and the silicon substrate itself.

However, based on mechanics, if, for example, a 1 micron thick layer of geranium is deposited on a silicon substrate that has been thinned to only a few microns in thickness, for example 3–4 microns of thickness, the stress of the germanium as deposited could not be built up, simply because the substrate does not have any bending stiffness to support it. Therefore, in order to comply with basic mechanics, the thinned silicon substrate upon which the germanium is depositing will have to adjust itself automatically to reduce the residual stress in the germanium silicon interface.

Thinning a substrate presents handling challenges. A thinner substrate is more difficult to manipulate and more prone to breakage than a relatively thick, for example, 800 micron substrate. In one embodiment, the thinned substrate could be removed completely from the remainder of the substrate. This thinned substrate, which is, for example 3–4 microns thick, would contain only the active area required to make the device. The thinned substrate could be supported by another carrier wafer established using under bump metallurgy or flip chip packaging. Support bumps could be evaporated and patterned onto a carrier wafer and the thinned substrate could be soldered to the bumps. This solder ball array should be positioned carefully so that it will not restrict the movement of the thinned substrate too much. Also, the melting temperature of the solder has to be compatible with the processing steps that remain for the thinned substrate. In another embodiment, the substrate could be selectively etched away beneath the areas where a thinned substrate is desired on a substrate of standard thickness. The substrate can be of the standard thickness in areas that require bending rigidity. Care should be taken in laying out the backside of this substrate to align the thinned substrate or a with the deposition requiring a thinned substrate, but little more is entailed in providing backside vias in wafers as manufactured today.

FIG. 1 is an illustration of a perfectly lattice-matched deposition of material 10 on material 20. The thickness of the deposited layer of material 10 in this example is approximately one micron. The thickness of the substrate material 20 in this example is approximately 800 microns. Because there is no mismatch between the deposition of material and the substrate material, there is no strain induced at the interface of the materials or within the material layers, themselves.

Figure 2:
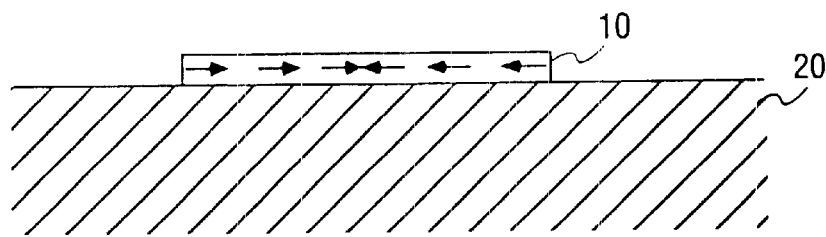
FIG. 2 is a schematic cross-sectional side view of a relatively thin deposition on a relatively thick substrate wherein the thin deposition is under compression.

FIG. 2 is an illustration of one embodiment of a deposition on a substrate. In this example, as in the silicon germanium system example, the deposited material 10 has a slightly larger morphologic structure or crystal lattice than the substrate material 20. The thickness of the substrate material is so great, that there is no flex or give in the substrate. This inability to flex or give confines the stress to the inter-layer area as seen in the figure. In this example, the deposited material is in compressive stress because its lattice is greater than a lattice of the substrate material.

Figure 3:
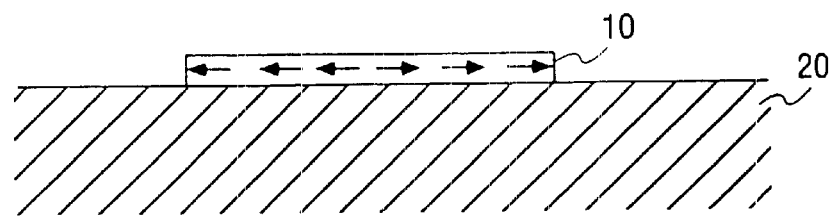
FIG. 3 is a schematic cross-sectional side view of a relatively thin deposition on a relatively thick substrate wherein the thin deposition is under tension.

FIG. 3 is an illustration of a thin deposition of a material 10 on a substrate layer 20 wherein the substrate layer 20 is greatly thicker than the thickness of the deposition material 10. The crystalline lattice of deposited material 10 in FIG. 3 is smaller than the crystal lattice of material 20 and therefore the deposited layer 10 is under tensile stress. This tensile stress is due to the mismatch between the materials. This tensile stress is formed at the interlayer of the materials and propagates into the deposited layer 10 and the substrate layer 20. The thickness of the substrate layer 20 in this figure is so great that the stress generated at the interface has no effect on the structure of the substrate and therefore, all of the stress is contained in the interlayer region.

FIGS. 4A–4G show one example of fabricating one embodiment of the thinned substrate. FIG. 4A shows a double side polished silicon wafer substrate 30, which has had a layer of silicon oxide 50 deposited on the front and back side of the substrate and a layer of silicon nitride 60 deposited on top of the silicon oxide on the front and back of the substrate. The back side of the substrate is patterned with photoresist 40 to expose holes in the back side oxide and nitride layers.

FIG. 4B shows the substrate after removal of the nitride and oxide layers covering the back side of the substrate 30. The structure in FIG. 4B can be etched using tetra-methyl ammonium hydroxide (TMAH) or potassium hydroxide (KOH). There are multiple techniques for stopping the etch at the precise depth desired. Ethylene diamine pyro catecol (EDP) can be used at about 100° C. to etch through some of the silicon substrate.

The etching of FIG. 4B results in the figures seen in FIG. 4C. The silicon substrate with the vias etched into it now labeled 30 still has the front side protective cover of silicon dioxide (silox) and nitride and the patterned mask silox nitride on the back side. These are removed by etching processes yielding the illustration shown in FIG. 4D.

FIG. 4D shows the silicon substrate with the cavity 30 etched into it. It is appreciate that this is an illustration of a small portion of the wafer. The thinned substrate represented in the illustration can be replicated multiple times throughout the wafer.

FIG. 4E shows the substrate of FIG. 4D once it has been patterned with photoresist to leave openings, for in one example, the deposition of a subsequent material over the front side (superior surface as viewed) of the substrate.

FIG. 4F shows the deposition of the material 70 such as platinum on the photoresist masked front side of the silicon substrate 30. Photoresist 40 protects a majority of the surface of the substrate and prevents material from depositing on the substrate. Deposited material 70 deposits on the photoresist except in areas where there is no photoresist and there the material 70 deposits on the silicon substrate surface.

FIG. 4G shows the structure after removal of the photoresist. The lift-off of the photoresist 40 removes with it the unwanted material 70 over the front side of the wafer, leaving the material pattern 70 only in those areas where material was intended to deposit on the silicon surface.

Figure 5:
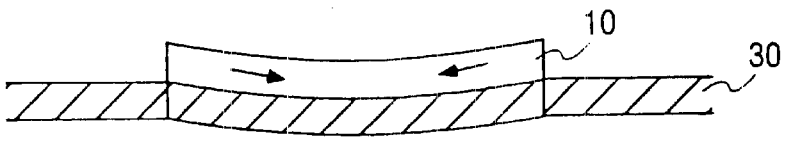
FIG. 5 is a schematic cross-sectional side view of a thin deposition on a thinned substrate under tension.

FIG. 5 is an illustration of a thinned membrane portion of a substrate 30 conforming with the deposition of a material 10 that has a smaller crystalline lattice than the substrate. As used herein, the phrase "mechanically compliant" means the stress induced by the mismatch between the materials is accommodated by strain in the substrate 30. This strain in the substrate allows a reduction in the stress in the interface due to the mismatch between the materials. Thus, the substrate is complying with the structural demands of the material deposited thereon.

Figure 6:
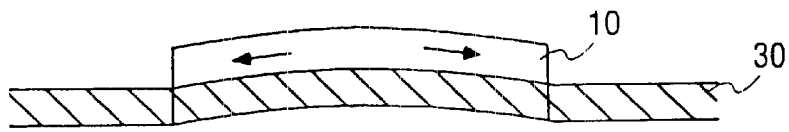
FIG. 6 is a schematic cross-sectional side view of a thin deposition on a thinned substrate under compression.

FIG. 6 shows a similarly compliant substrate 30 responding to a stress generated by a deposited layer 10 when the deposited layer has a larger crystalline lattice than the substrate. Therefore, the deposited layer is in compression.

In an example of the embodiment of the invention wherein a titanium metal film is deposited on the silicon substrate, a film on a substrate with about 800 micron thickness will have a stress in the titanium film of approximately –330 megapascals, which is a common residual stress level out of an e-beam chamber on a regular silicon wafer. Once the silicon wafer is thinned to approximately a three micron thickness beneath the titanium layer, the residual stress is reduced to about –60 megapascals. This reduction in stress is accomplished by allowing the silicon substrate to conform to the stress demands of the titanium metal layer deposited thereon, after processing the via for mechanical integrity.

The ability of the thinned substrate to conform to the stress generated by the deposited material is a function of the membrane behavior of the thinned substrate. The thinned substrate deforms in response to the stress generated by the mismatch between the material deposited and the material that makes up the substrate. This mechanical compliance then of the thinned substrate to the deposited material takes place in situ as the material is deposited on the thinned substrate. As the stress is generated and increased, the compliance of the thinned substrate with the deposited material increases as well. This mechanical compliance of the thinned substrate with the deposited material in situ during deposition allows the stress in the two layers to relax without formation of defects in the lattice.

Figure 7:
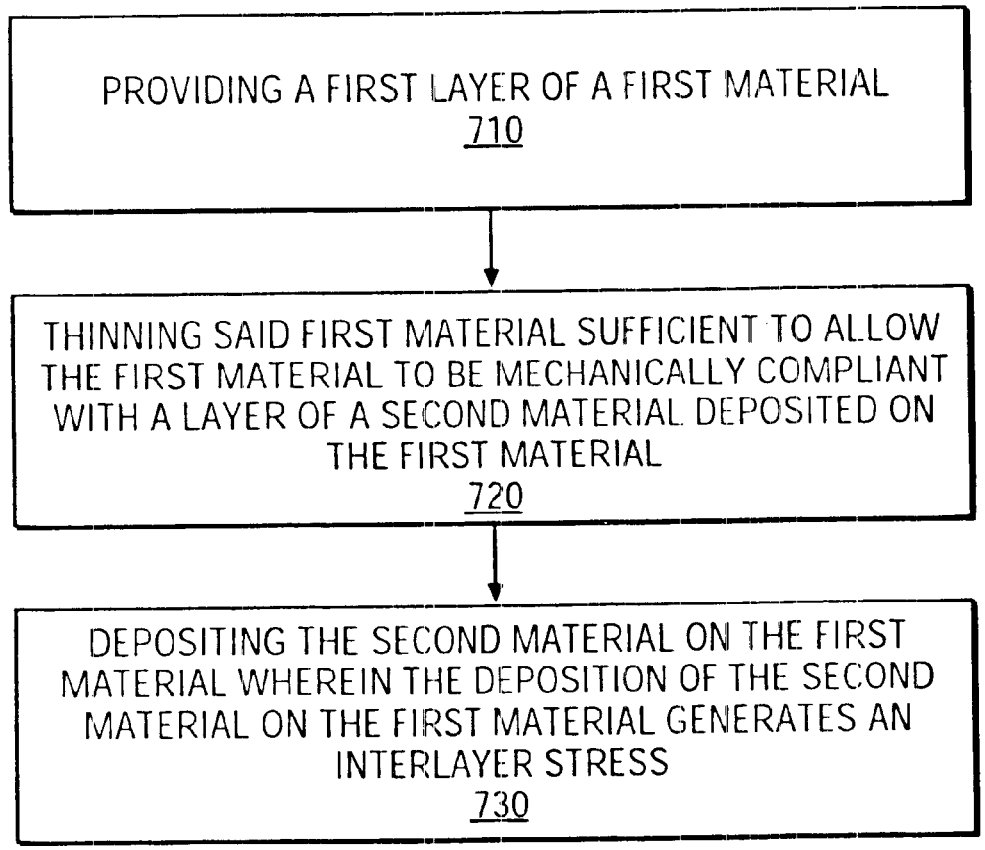
FIG. 7 is a flow chart demonstrating one embodiment of the claims.

FIG. 7 is a flow chart showing one method of fabricating the mechanically compliant substrate. A silicon substrate is provided having a thickness of typically between 750–800 microns at block 710. The substrate is thinned sufficient to allow the substrate to mechanically comply with a layer of second material deposited on the first material at block 720. The second material is deposited on the first material wherein the second material deposited on the first material generates an interlayer stress at block 730. This interlayer stress can be relieved by compliance of the first material with the second material.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative, rather than a restrictive, sense.

What is claimed is:

1. An apparatus comprising:
   a first layer of a semiconductor first material on a substrate;
   a second material deposited on the first material having a property such that it is morphologically mismatched with the first material, wherein the second material is one of a semiconductor and a metal; and
   wherein the first layer has a thickness selected to allow mechanical compliance of the first material with a deposition of the second material to reduce an interlayer stress generated at an interlayer interface between the first material and the second material due to the morphological mismatch between the first material and the second material.

2. The apparatus of claim 1, wherein a thickness of the first layer is less than 10 microns.

3. The apparatus of claim 1, wherein the interlayer stress is generated by a coefficient of thermal expansion mismatch between the first material and the second material.

4. The apparatus of claim 1, wherein the first layer comprises a mechanically compliant section of the first material with a partial deposition of the second material deposited on the section of the first material.

5. The apparatus of claim 1, wherein the first layer comprises at least one mechanically compliant etched section of the first material to allow mechanical compliance to reduce an etching interlayer stress due to a morphological mismatch between the first material and a second material.

6. The apparatus of claim 1, wherein the morphological mismatch comprises the second material having one of a smaller crystalline lattice than the first material and a larger crystalline lattice than the first material.

* * * * *

UNITED STATES PATENT AND TRADEMARK OFFICE
CERTIFICATE OF CORRECTION

PATENT NO.     : 6,614,065 B2
DATED          : September 2, 2003
INVENTOR(S)    : Zheng It is certified that error appears in the above-identified patent and that said Letters Patent is hereby corrected as shown below:

<u>Title page,</u>
Item [75], Inventor, delete "Dawai" and insert -- Dawei --.

Signed and Sealed this

Twenty-seventh Day of July, 2004

JON W. DUDAS
*Acting Director of the United States Patent and Trademark Office*